United States Patent
Yang

(10) Patent No.: US 7,092,706 B2
(45) Date of Patent: Aug. 15, 2006

(54) APPARATUS AND METHOD FOR SIGNAL STRENGTH COMPENSATION OF HIGHLY TIME-VARIANT MOBILE RADIO CHANNELS AND RECEPTION UNIT FOR MOBILE RADIO TRANSMISSION

(75) Inventor: Bin Yang, Herrenberg (DE)

(73) Assignee: Infineon Technologies AG, Munich (DE)

( * ) Notice: Subject to any disclaimer, the term of this patent is extended or adjusted under 35 U.S.C. 154(b) by 532 days.

(21) Appl. No.: 10/412,086

(22) Filed: Apr. 11, 2003

(65) Prior Publication Data

US 2004/0038650 A1    Feb. 26, 2004

Related U.S. Application Data

(63) Continuation of application No. PCT/DE01/03482, filed on Sep. 6, 2001.

(30) Foreign Application Priority Data

Oct. 11, 2000 (DE) ................................ 100 50 330

(51) Int. Cl.
*H04Q 7/20* (2006.01)
(52) U.S. Cl. .................. 455/423; 455/67.11; 455/134; 455/226.2; 455/161.3; 455/67.13; 455/69; 455/67.16; 375/140; 375/138; 375/349; 324/309; 324/307; 324/316
(58) Field of Classification Search ............. 455/67.11, 455/69, 67.13, 67.16, 423, 134, 161.3, 424; 375/140, 138, 349; 324/309
See application file for complete search history.

(56) References Cited

U.S. PATENT DOCUMENTS

| | | |
|---|---|---|
| 5,083,304 A | 1/1992 | Cahill |
| 5,185,764 A | 2/1993 | Baier |
| 5,287,556 A | 2/1994 | Cahill |
| 5,301,364 A | 4/1994 | Arens et al. |
| 5,809,399 A * | 9/1998 | Tuutijarvi et al. ......... 455/63.1 |
| 5,901,173 A * | 5/1999 | Stephens et al. ............ 375/227 |
| 6,067,646 A * | 5/2000 | Starr .......................... 714/701 |
| 6,094,463 A * | 7/2000 | Stephens et al. ............ 375/326 |
| 6,097,768 A * | 8/2000 | Janesch et al. ............. 375/330 |
| 6,148,048 A * | 11/2000 | Kerth et al. ................ 375/350 |
| 6,173,187 B1 * | 1/2001 | Salonaho et al. ........... 455/453 |
| 6,201,954 B1 * | 3/2001 | Soliman ................... 455/226.2 |
| 6,321,073 B1 * | 11/2001 | Luz et al. ................ 455/239.1 |
| 6,603,826 B1 * | 8/2003 | Cupo et al. ................ 375/346 |
| 6,614,806 B1 * | 9/2003 | Nanni ........................ 370/468 |

FOREIGN PATENT DOCUMENTS

| | | |
|---|---|---|
| DE | 39 26 277 A1 | 2/1991 |
| EP | 0 564 850 A1 | 10/1993 |
| EP | 0 945 978 A1 | 9/1999 |

* cited by examiner

*Primary Examiner*—Marceau Milord
(74) *Attorney, Agent, or Firm*—Laurence A. Greenberg; Werner H. Stemer; Ralph E. Locher

(57) ABSTRACT

A signal strength compensation unit for mobile radio receivers is connected upstream of the channel estimator and the channel equalizer and compensates for, in particular, the great, brief signal strength fluctuations within a data burst. Likewise, a method for signal strength compensation compensates for brief signal strength fluctuations within the data burst. To these ends, a signal strength average is determined from the signal strengths for the previously received data symbols. The current signal is then aligned with this signal strength average. The inventive signal strength compensation allows the bit error rate during data equalization to be significantly reduced.

30 Claims, 3 Drawing Sheets

APPARATUS AND METHOD FOR SIGNAL STRENGTH COMPENSATION OF HIGHLY TIME-VARIANT MOBILE RADIO CHANNELS AND RECEPTION UNIT FOR MOBILE RADIO TRANSMISSION

CROSS-REFERENCE TO RELATED APPLICATION

This application is a continuation of copending International Application No. PCT/DE01/03482, filed Sep. 6, 2001, which designated the United States and was not published in English.

BACKGROUND OF THE INVENTION

Field of the Invention

The invention relates to a reception unit for mobile radio transmission and to an apparatus and a method for signal strength compensation in a mobile radio receiver.

When transmitting data signals over a mobile radio channel, characteristic power fluctuations occur that make it difficult to equalize the received signals. By way of example, any increase in the distance between mobile phone and fixed station causes a continuous reduction in the power of the received signals. Besides such slow variations in the signal power, however, brief signal power fluctuations occur particularly in rural areas, particularly if the mobile phone is moving at high speed (for example in a car). These brief fluctuations occur particularly when the direct transmission path between transmitter and receiver is periodically in the shadow of emergent obstacles. As can be seen from FIG. 5A, these signal strength fluctuations are of such short duration that even within a single data burst the power of the signals received fluctuates greatly.

Various methods of power alignment for received mobile radio signals have been proposed. In the case of "automatic gain control" (AGC), the received signals in a burst are scaled using a multiplier that is stipulated per burst. This boosts bursts that have low signal power, whereas bursts with a high signal strength are attenuated. In this way, it is possible to keep the average signal power of the burst constant. However, AGC does not compensate for brief power fluctuations within a burst.

Another method for compensating for signal strength fluctuations is "channel tracking". This method involves the channel coefficients that model the channel response being redetermined at regular intervals. This allows power fluctuations in the received signals to be included during equalization.

Segment-based channel tracking involves channel estimation being carried out again after every received data segment. By contrast, symbol-based channel tracking involves the channel coefficients permanently being aligned with the current transmission conditions. To redetermine the channel coefficients, the least squares method (least mean square algorithm) is normally used, which determines the channel coefficients iteratively on the basis of the learning sequence.

The speed at which the LMS algorithm converges is stipulated by the algorithm's step size. Rapid signal strength fluctuations can be tracked only if the step size is chosen to be of appropriate magnitude. This is not practical for a number of reasons, however. When a large step size is used, the LMS algorithm frequently diverges, which means that the new channel coefficients cannot be ascertained. Another problem when using large step sizes is that the noise is occasionally amplified to such an extent that the result of channel estimation becomes unusable. The use of channel tracking to compensate for brief power fluctuations is also not suitable because the large step sizes required for this purpose result in significant impairment of the tracking in the case of power fluctuations that have little time-variance. Channel tracking is therefore not suitable for compensating for brief power fluctuations when large step sizes are used either.

SUMMARY OF THE INVENTION

It is accordingly an object of the invention to provide an apparatus and a method for signal strength compensation of highly time-variant mobile radio channels and reception unit for mobile radio transmission that overcome the hereinafore-mentioned disadvantages of the heretofore-known devices of this general type and that provide signal strength compensation for a sequence of received signals and that can be used for processing large signal strength fluctuations within a burst.

With the foregoing and other objects in view, there is provided, in accordance with the invention, an apparatus for signal strength compensation for a sequence of received digital signal values in a mobile radio receiver. The apparatus includes a signal strength determiner, two calculators, and a signal strength aligner. The signal strength determiner produces a signal strength value representing a signal strength of a current digital signal value. The calculator calculates a signal strength average, tracked to the current signal value, from previous signal values in the sequence. The signal strength aligner aligns the current digital signal value with the signal strength average using a calculation.

With the objects of the invention in view, there is also provided a reception unit for mobile radio transmission. The reception unit includes a channel estimator, a channel equalizer, and a signal strength compensation apparatus as discussed in the previous paragraph. The channel estimator ascertains channel coefficients $h_0, \ldots h_L$ for modeling a transmission channel. The channel equalizer equalizes received signals using the channel coefficients ascertained by the channel estimator. The signal strength compensation apparatus is connected upstream of the channel estimator and the channel equalizer.

With the objects of the invention in view, there is also provided a method for signal strength compensation for a sequence of received digital signal values. The method includes the following steps. The first step is a) ascertaining a signal strength value representing a signal strength of a current signal value. The next step is b) determining a signal strength average tracked to the current signal value from previous signal values in the sequence. The next step is c) aligning the current signal value with the signal strength average determined in step b) by using a calculation.

The inventive apparatus for signal strength compensation for a sequence of received digital signal values has a signal strength determiner that produces a signal strength value that represents the signal strength of the current signal value. The apparatus includes a calculator for calculating a signal strength average, tracked to the current signal value, from previous signal values in the sequence. In addition, the apparatus for signal strength compensation has a signal strength aligner that aligns the current signal value with the determined signal strength average by a calculation.

In relation to a data burst, this means that the signal strength average is determined from the previous signal values in the burst and is therefore constantly (with a certain degree of inertia) being tracked to the current signal. This means that even brief signal strength fluctuations within a data burst can be compensated for. A signal value whose signal strength is below that of the previous average is boosted, whereas a signal value with a signal strength value above the average is attenuated. This reduces the fluctuations in the signal power, and the downstream channel estimation and channel equalization improve.

The inventive apparatus for signal strength compensation allows a significant reduction in the bit error rate based on the transmitted power. A prescribed bit error rate can in some cases be achieved with a transmitted power reduced by up to 3 dB.

Unlike the previously known automatic gain control (AGC) method, the inventive apparatus for signal strength compensation can also be used to compensate for the brief signal strength fluctuations arising within a burst, for example caused by the reception path being in shadow. Since the downstream channel equalizer actually processes the received signals whose signal strength has been aligned, convergence problems when determining the channel coefficients are avoided.

The signal strength alignment with the signal strength average leaves the phases of the received signal values unchanged. The received signal is corrected with the correct phase, and the signal values whose signal strength has been corrected can therefore be processed by the downstream channel estimator and channel equalizer in a known manner.

The inventive reception unit for mobile radio transmission includes a channel estimator that ascertains the channel coefficients $h_0, \ldots h_L$ for modeling the transmission channel, and also a channel equalizer, which uses the channel coefficients ascertained by the channel estimator to equalize the received signal values.

In addition, the inventive reception unit has a signal strength compensation apparatus as described previously connected upstream of the channel estimator and the channel equalizer. As described above, the apparatus for signal strength compensation includes a signal strength determiner a calculator for calculating a tracked signal strength average, and a signal strength aligner. While, on the basis of the prior art, the highly time-variant received signals are used for channel estimation, the inventive solution involves the channel coefficients being determined on the basis of signals whose signal strength has been corrected. The channel equalizer is also supplied with the corrected signal values, which are then equalized in line with the channel coefficients ascertained by the channel estimator. The upstream signal strength compensation apparatus can compensate for brief power fluctuations in the received signal much more effectively than would be possible through constant tracking of the channel estimation. Since signal strength compensation is performed while retaining the phases of the signal values, the corrected signals can be used for channel equalization.

In line with one advantageous embodiment of the invention, the signal strength aligner divides the current signal value by the signal strength average. The signal strength average follows the variation in the signal strength with a certain degree of inertia. If the received signal can be received at high power, then the value of the signal strength average is also high, and to this extent the division attenuates the current signal value. Conversely, poor reception causes the signal strength average to assume a low value, and the weak received signal is boosted by the division. Dividing the current signal value by the signal strength average is the simplest way of compensating for signal strength.

It is advantageous if the signal strength aligner determines the signal strength average from the respective signal strength values for the previous signal values in the sequence, including the signal strength value for the current signal value. This practice takes the current signal value into account when forming averages. A particularly high or particularly low current value immediately raises or lowers the signal strength average. This makes more effective signal strength compensation possible.

Alternatively, it can also be advantageous if the signal strength aligner determines the signal strength average from the respective signal strength values for the previous signal values in the sequence without the signal strength value for the current signal value. From the point of view of processing speed, this solution is the better one. Since the current signal value does not need to be taken into account when forming the signal strength average, the signal strength average used for scaling is actually available when the current signal value arrives.

It is advantageous if the received signal values are complex signals which respectively include an inphase signal i(k) and a quadrature signal q(k). Complex-value signals are the normal standard in the mobile radio sector.

Advantageously, the signal strength aligner divides both the inphase signal i(k) and the quadrature signal q(k) by the signal strength average. The effect achieved by these two division operations is that the magnitude of the overall signal is normalized to the signal strength average.

It is advantageous if the signal strength determiner determines the signal strength value which is representative of a signal value's signal strength by adding the magnitude of the inphase signal i(k) and the magnitude of the quadrature signal q(k). The magnitude of the respective signal can be obtained very easily by virtue of the arithmetic sign of the respective component being ignored in the addition. This embodiment of the invention requires no squaring of the inphase signal or the quadrature signal, and is therefore the easiest way of determining the signal strength value. To this extent, this method of signal strength determination demands the least complexity.

Alternatively, it is advantageous if the signal strength determiner determines the signal strength value that is representative of a signal value's signal strength by adding the squared inphase signal $i(k)^2$ and the squared quadrature signal $q(k)^2$. The magnitude of complex-value signal values is normally ascertained by adding the squares of the magnitudes and then extracting the square root, because the square of the magnitudes for the overall signal corresponds to the sum of the squared real part and the squared imaginary part. The only thing that matters in the case of the present invention is that a measure, which is characteristic of the signal strength, is obtained. It is therefore also possible to dispense with the final extraction of a square root.

Advantageously, the calculator for calculating a signal strength average tracked to the current signal value includes an adder that produces the current signal strength average by adding the previous signal strength average multiplied by $\lambda_1$ and the current signal value's signal strength average multiplied by $\lambda_2$, where $\lambda_1 + \lambda_2 = 1$. The current signal strength average is thus made up of the previous signal strength average with the component $\lambda_1$ and of the current signal strength average with the component $\lambda_2$. Such formation of averages is referred to as exponential averaging. Earlier signal values make less of a contribution to the current average the further back they are. Their proportion of the current signal strength average pales with $\lambda_2 \cdot \lambda_1^m$, where m is a natural number and indicates how far in the past the earlier signal value lies. The current signal strength value contributes the component $\lambda_2$ to the current signal strength average and to this extent makes the largest contribution to the average. The exponential averaging can follow the signal strength variation sufficiently well, which means that effective signal strength compensation can be achieved.

Advantageously, the calculator for calculating a signal strength average tracked to the current signal value includes a register for the signal strength average that respectively stores the current signal strength average and makes it available for calculating the next signal strength average. This iterative practice means that the signal strength average does not have to be completely recalculated upon every pass. Instead, the stored previous average is taken as a starting point for determining the current signal strength average with little complexity.

Advantageously, $\lambda_1=1-2^{-n}$ and $\lambda_2=2^{-n}$ are chosen, where n is a natural number. n can be used to set the weight of the current signal power's contribution to the signal strength average. The larger n is chosen, the greater is the contribution by the past averages, and the smaller is the contribution by the current signal strength value. Irrespective of the choice of n, $\lambda_1+\lambda_2=1$ is always ensured.

In this case, the signal strength value for the current signal can advantageously be multiplied by $\lambda_2=2^{-n}$ using a shift register. Similarly, the previous signal strength average can advantageously be multiplied by $\lambda_1=1-2^{-n}$ using an adder and a shift register. This respectively makes use of the fact that shifting a binary number to the right n times using a shift register is equivalent to multiplication by $2^{-n}$. It is therefore possible to use simple shift registers instead of multipliers, and this allows simple and inexpensive implementation.

It is advantageous if the signal strength aligner aligns the current signal value with the signal strength average only if the variation in the signal strength within the sequence exceeds a prescribed threshold. If the signal strength within the burst fluctuates only slightly, it is advantageous in respect of the bit error rate to leave the received signal unchanged. The best overall result is obtained if the inventive signal strength alignment is performed only for bursts in which the fluctuation in the signal strength exceeds a prescribed threshold.

In this case, it is particularly advantageous if the signal strength aligner aligns the respective current signal values in a sequence with the respective signal strength averages for the sequence only if the maximum signal strength average for the sequence and the mean signal strength average for the sequence differ to a sufficient extent. In this embodiment of the invention, the signal values associated with a burst need to be buffered so that the mean signal strength average and the maximum signal strength average can be determined. Comparison of the mean signal strength average and of the maximum signal strength average can be used to decide whether or not the inventive signal strength compensation needs to be performed.

In this case, it is particularly advantageous to calculate the quotient of the maximum signal strength average and of the mean signal strength average for the sequence and to perform the signal strength compensation if the quotient exceeds a prescribed threshold value.

Other features that are considered as characteristic for the invention are set forth in the appended claims.

Although the invention is illustrated and described herein as embodied in an apparatus and a method for signal strength compensation of highly time-variant mobile radio channels and a reception unit for mobile radio transmission, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
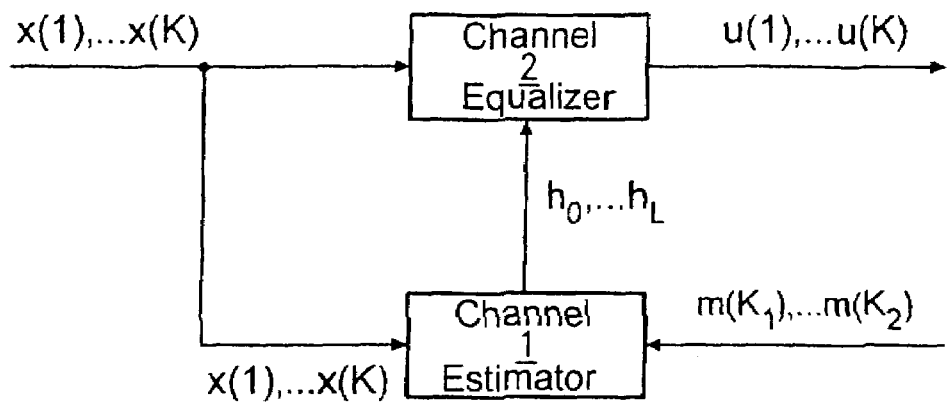
FIG. 1 is a block diagram showing a mobile radio receiver according to the prior art that has a channel estimator and a channel equalizer.

Referring now to the figures of the drawings in detail and first, particularly to FIG. 1 thereof, there is shown a mobile radio receiver based on the prior art that includes a channel estimator 1 and a channel equalizer 2. The received data symbols x(k) (k=1, . . . K) are distorted on account of the mobile radio channel's multipath transmission characteristic. The received, distorted data symbols x(k) are supplied to the channel estimator 1, which correlates the received data symbols with the undistorted data symbols in the training sequence $m(K_1)$, . . . $m(K_2)$, in order to determine the channel coefficients $h_0$, . . . $h_L$ in this way. In this context, L denotes the channel's memory.

The channel coefficients ascertained in this manner represent a model of the channel's transmission response. The channel coefficients $h_0$, . . . $h_L$ are supplied to the channel equalizer 2, which uses them to equalize the received, distorted data symbols x(k) and thus ascertains the equalized data symbols u(k) (k=1, . . . K). Equalization is advantageously performed using the Viterbi method.

Figure 2:
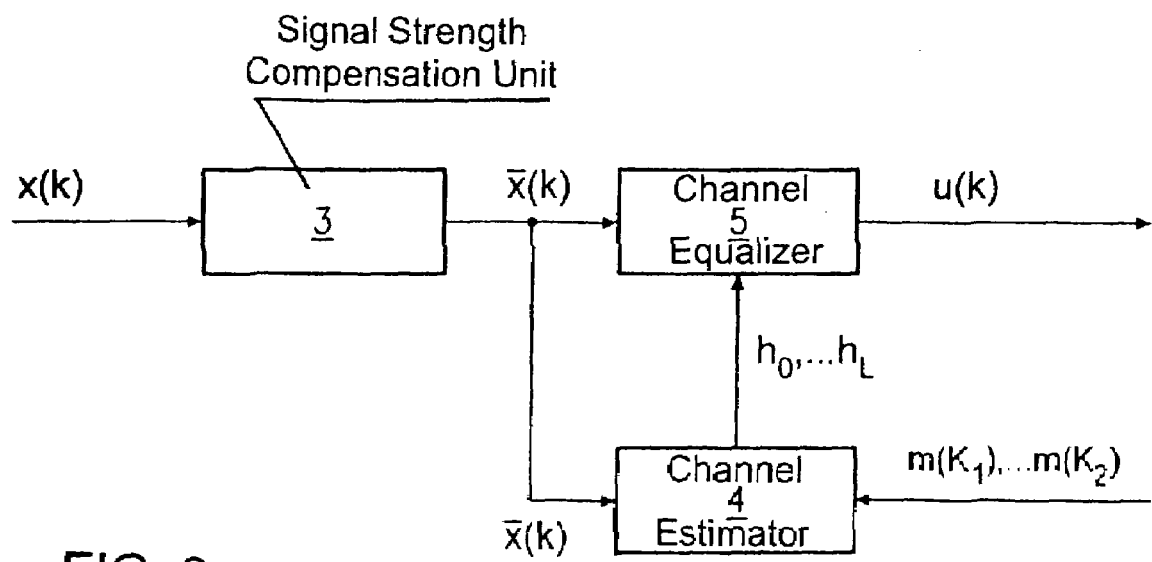
FIG. 2 is a block diagram showing a reception unit according to the invention for mobile radio transmission that additionally has a signal strength compensation unit.

FIG. 2 shows a block diagram of the mobile radio receiver modified in accordance with the invention. The received, distorted data symbols x(k) (k=1, . . . K) are first supplied to the signal strength compensation unit 3 connected upstream of the channel estimator 4 and the channel equalizer 5. If the signal strength fluctuation within a received data burst exceeds a prescribed threshold, the compensation unit 3 performs signal strength alignment for the received data symbols x(k). In this way, the data symbols $\bar{x}(k)$ (k=1, . . . K) still with distortion but with aligned signal strengths are obtained, which are supplied to the channel estimator 4 and to the channel equalizer 5. Based on these data symbols $\bar{x}(k)$, the channel estimator 4 ascertains the channel coefficients $h_0$, . . . $h_L$, which it transmits to the channel equalizer 5. This channel model is then taken as a basis for equalizing the data symbols $\bar{x}(k)$ in order to obtain the equalized data symbols $u(k)$.

The way in which the upstream signal strength compensation unit 3 works will be illustrated below with reference to FIG. 3. The received data symbols $x(k)$ have complex values and, to this extent, can be represented by an inphase component $i(k)$ and by a quadrature component $q(k)$:

$$x(k)=i(k)+i \cdot q(k).$$

Both the inphase component and the quadrature component are supplied to the signal strength determination unit 6. To calculate the signal strength $s(k)$, there are a number of options. One way is to add the squared inphase component and the squared quadrature component, so that $$s(k)=i(k)^2+q(k)^2.$$

Less computation is involved if the signal strength is ascertained by adding the magnitudes $$|i(k)|$$

and $$|q(k)|$$

of the two signal components, so that the signal strength $s(k)$ is obtained as $$s(k)=|i(k)|+|q(k)|.$$

To calculate the magnitude of the signal component, it is sufficient to ignore the arithmetic sign of the respective signal component.

Next, the signal strength average $\bar{s}(k)$ at the time k is calculated. To form averages, exponential averaging in line with the formula $$\bar{s}(k)=\lambda_1 \cdot \bar{s}(k-1)+\lambda_2 \cdot s(k)$$

is particularly suitable. In this context, $\bar{s}(k-1)$ denotes the previous average for the signal strength. For the two coefficients $\lambda_1$ and $\lambda_2$, $$0<\lambda_1<1,\ 0<\lambda_2<1$$

and $$\lambda_1+\lambda_2=1$$

apply. To this extent, the factor $\lambda_1$ indicates the previous signal strength average's contribution to the new signal strength average, while $\lambda_2$ indicates the current signal strength value's contribution to the new average. This type of formation of averages reveals that the contributions of earlier signal strength values $s(k-2)$, $s(k-3)$, ... $s(k-m)$ contribute less to the new signal strength average the further back they lie. The signal strength value $s(k-m)$, which is m time units back, now contributes the factor $$\lambda_1^m$$

to the new average.

To calculate the new signal strength average, the multiplier 7 multiplies the current signal strength value $s(k)$ by the factor $\lambda_2$ and then supplies it to the adder 10. The previous signal strength average $\bar{s}(k-1)$ stored in the register 8 is multiplied by the factor $\lambda_1$ by the multiplier 9 and is then likewise supplied to the adder 10. The adder 10 adds the terms $$\lambda_1 \cdot \bar{s}(k-1)$$

and $$\lambda_2 \cdot s(k)$$

and thus determines the new signal strength average $\bar{s}(k)$.

The new signal strength average $\bar{s}(k)$ is stored in the register 8; in addition, the signal strength average $\bar{s}(k)$ is supplied to the division units 12 and 15 via the signal lines 11 and 14. The inphase signal $i(k)$ applied to the division unit 12 is divided by the current signal strength average $\bar{s}(k)$ in order to obtain the corrected inphase signal $$\bar{i}(k)=\frac{i(k)}{\bar{s}(k)},$$

which is provided at the output 13 of the division unit 12. Similarly, the division unit 15 calculates the corrected quadrature signal $$\bar{q}(k)=\frac{q(k)}{\bar{s}(k)},$$

which appears at the output 16 of the division unit 15.

The best equalization results are obtained if only highly time-variant data bursts are subjected to signal strength correction. For data bursts that have only small signal strength fluctuations, no signal strength compensation is performed.

To obtain a measure of the fluctuation of the signal strength within a data burst, the signal strength averages $$\bar{s}(k),$$

where k=1, 2, ..., K, are taken as a basis for determining the maximum signal strength average $$\bar{s}_{max}=\max\{\bar{s}(k)|k=1,2,\ldots,K\}$$

and the mean signal strength average $$\bar{s}_{mean}=\frac{1}{K}\sum_{k=1}^{K}\bar{s}(k)$$

for the data burst. In this case, K denotes the number of data symbols per data burst.

With only slight signal strength fluctuation in the received data symbols, the fluctuations in the respectively tracked signal strength averages $\bar{s}(k)$ are also slight. The maximum signal strength average $\bar{s}_{max}$ is only slightly higher than the mean signal strength average $\bar{s}_{mean}$. By contrast, great signal strength fluctuations within a data burst result in $\bar{s}_{max}$ being much higher than $\bar{s}_{mean}$.

To this extent, the quotient $$\frac{\bar{s}_{max}}{\bar{s}_{mean}}$$

is a good measure of the signal strength fluctuation within the data burst under consideration. If this quotient is only slightly greater than 1, no signal strength alignment needs to be performed. If, by contrast, the quotient $$\frac{\overline{s}_{max}}{\overline{s}_{mean}}$$

exceeds a prescribed threshold value t, then the inventive signal strength correction needs to be performed.

Figure 3:
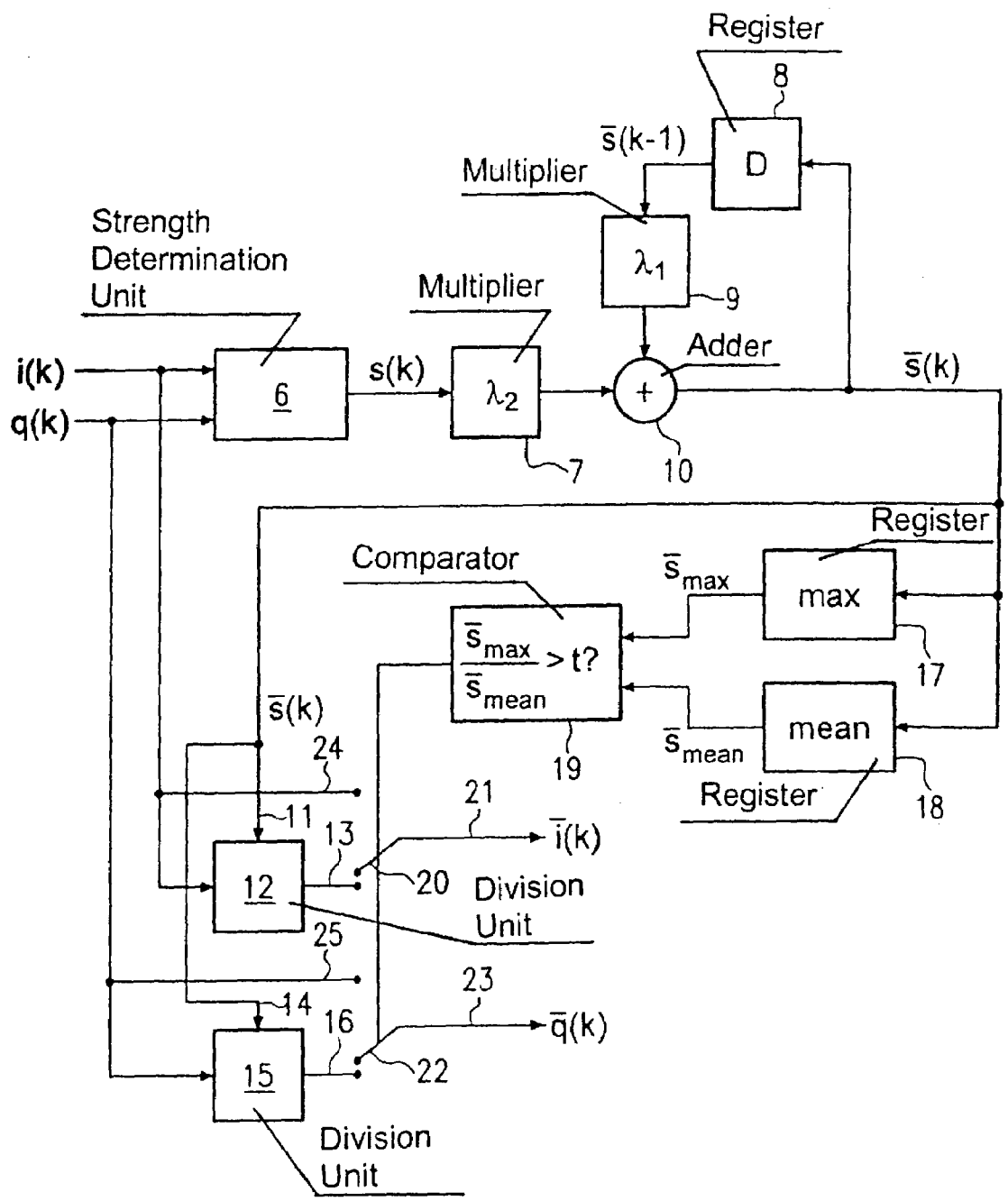
FIG. 3 is a block diagram showing a signal strength compensation unit according to the invention.

In the case of the implementation shown in FIG. 3, the inventive signal strength alignment is performed only selectively in the event of great signal strength fluctuation.

For this purpose, a register 17 for the maximum signal strength average $\overline{s}_{max}$ and a register 18 for the mean signal strength average $\overline{s}_{mean}$ are provided. The values of $\overline{s}_{max}$ and $\overline{s}_{mean}$ ascertained for a particular data burst are supplied to the comparator 19, which calculates the quotient $$\frac{\overline{s}_{max}}{\overline{s}_{mean}}$$

and compares it with the threshold value t. On the basis of the result of the comparison, the switches 20 and 22 are controlled. If $$\frac{\overline{s}_{max}}{\overline{s}_{mean}} > t$$

is true, then the output 13 of the division unit 12 is connected to the output 21, and this output 21 produces the corrected value $$\overline{i}(k) = \frac{i(k)}{\overline{s}(k)}.$$

Similarly, the output 16 of the division unit 15 is connected to the output 23, at which the value $$\overline{q}(k) = \frac{q(k)}{\overline{s}(k)}$$

appears.

By contrast, with small signal strength fluctuations within the data burst under consideration, the following is true $$\frac{\overline{s}_{max}}{\overline{s}_{mean}} \leq t.$$

In this case, no signal strength correction needs to be performed. The switches 20 and 22 are in their top position. The switch 20 connects the signal line 24 to the output 21, which therefore provides the unchanged value i(k). Similarly, the switch 22 connects the signal line 25 to the output 23, which provides the value q(k).

In summary, the following is therefore true for the values $\overline{i}(k)$ and $\overline{q}(k)$ of the inphase signal and the quadrature signal when signal strength compensation has been performed:

$$\overline{i}(k) = \begin{cases} i(k) & \text{for } \overline{s}_{max}/\overline{s}_{mean} \leq t \\ i(k)/\overline{s}(k) & \text{for } \overline{s}_{max}/\overline{s}_{mean} > t \end{cases}$$

$$\overline{q}(k) = \begin{cases} q(k) & \text{for } \overline{s}_{max}/\overline{s}_{mean} \leq t \\ q(k)/\overline{q}(k) & \text{for } \overline{s}_{max}/\overline{s}_{mean} > t \end{cases}$$

The values of $\overline{s}_{max}$ and $\overline{s}_{mean}$ are available only after a data burst which is to be considered has been received in full. Only after evaluation of the signal strengths of all received data symbols in a data burst is it possible to decide whether or not the inventive signal strength alignment needs to be performed. To this extent, it is necessary to store the data burst's received data symbols in data buffers provided for this purpose. These data buffers for storing the values of i(k), q(k) (where k=1, 2, . . . K) associated with the current data burst are not shown in FIG. 3, for reasons of clarity.

To calculate $\lambda_1$ $$\overline{s}(k) = \lambda_1 \cdot \overline{s}(k-1) + \lambda_2 \cdot s(k),$$

FIG. 3 contains the delay element 8, the two multipliers 7 and 9 and the adder 10.

In line with one advantageous embodiment, $$\lambda_1 = 1 - 2^{-n}$$

and $$\lambda_2 = 2^{-n}$$

are set, where n is a natural number. This choice of $\lambda_1$ and $\lambda_2$ ensures that $$\lambda_1 + \lambda_2 = 1.$$

The advantage of this choice of $\lambda_1$ and $\lambda_2$ is that the complex multipliers 7 and 9 can be replaced by rightward shifters.

Figure 4:
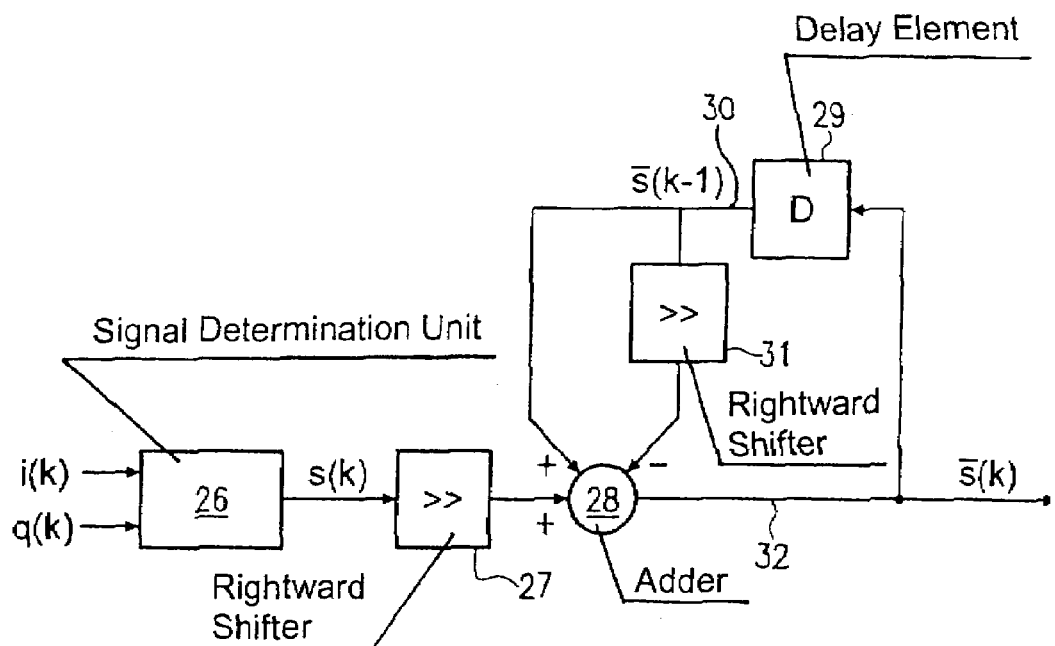
FIG. 4 is a block diagram showing an embodiment of a reception unit according to the invention in which the signal strength average is determined using shift registers.

A corresponding embodiment is shown in FIG. 4. The signal strength determination unit 26 determines the associated signal strengths s(k) from the values of i(k) and q(k). To multiply these signal strength values by $$\lambda_2 = 2^{-n},$$

the rightward shifter 27 is provided, which shifts the bit pattern for the signal strength value s(k) n positions to the right. The result of the rightward shift operation is supplied to the adder 28. The delay element 29 stores the previous signal strength average $\overline{s}(k-1)$. This value is intended to be multiplied by $$\lambda_1 = 1 - 2^{-n}.$$

To this end, the value of $\overline{s}(k-1)$ is supplied, firstly, unchanged to the adder 28 via the signal line 30. Secondly, $\overline{s}(k-1)$ is shifted n positions to the right by the rightward shifter 31; the result of this rightward shift operation is supplied to the adder 28 with a negative arithmetic sign. At the output 32, the adder 28 delivers the new signal strength average $$\overline{s}(k) = (1 - 2^{-n}) \cdot \overline{s}(k-1) + 2^{-n} \cdot s(k),$$

which is in turn stored in the delay element 29.

Figure 5A:
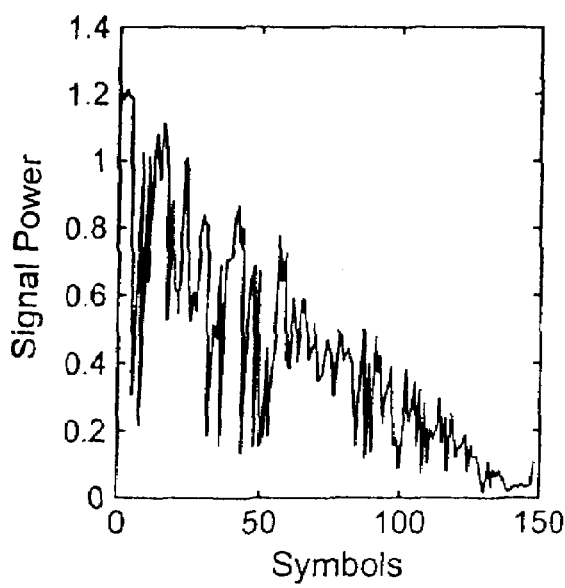
FIG. 5A is a graph showing the signal strength variation within a highly time-variant data burst before signal strength compensation is performed by plotting signal power versus symbols.
Figure 5B:
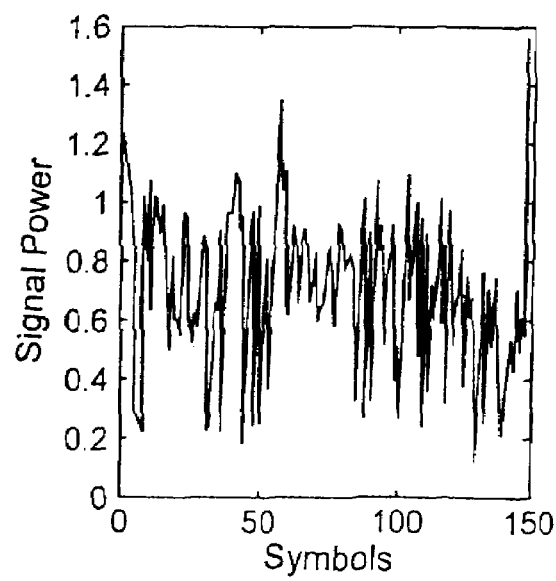
FIG. 5B is a graph showing the signal strength variation for the data burst shown in FIG. 5A after signal strength compensation has been performed.

The way in which the inventive signal strength compensation works is illustrated with reference to FIGS. 5A and 5B. FIG. 5A shows the signal strength variation for the data symbols in a data burst. Such pronounced brief fluctuations in the signal strength are not unusual, because the direct transmission path between mobile phone and fixed station is frequently in shadow. The data shown in FIG. 5A are actually measured signal strengths and not a simulation, for example. FIG. 5B shows the signal strength variation for the same data burst after the inventive signal strength compensation has been performed. Again, these are actual data. If the data symbols whose signal strengths have been corrected are supplied to the channel estimator and to the channel equalizer, the bit error rate during equalization can be significantly reduced.

I claim:

1. An apparatus for signal strength compensation for a sequence of received digital signal values in a mobile radio receiver, comprising:
    a signal strength determiner producing a signal strength value representing a signal strength of a current digital signal value;
    a calculator calculating a signal strength average, tracked to the current digital signal value, from previous digital signal values in the sequence; and
    a signal strength aligner aligning the current digital signal value with the signal strength average by using a calculation.

2. The apparatus according to claim 1, wherein said signal strength aligner has a division unit dividing the current digital signal value by the signal strength average.

3. The apparatus according to claim 1, wherein said signal strength aligner determines the signal strength average from respective signal strength values for the previous digital signal values in the sequence, including the signal digital strength value of the current signal.

4. The apparatus according to claim 1, wherein said signal strength aligner determines the signal strength average from respective signal strength values for the previous signal values in the sequence without the signal strength value of the current signal value.

5. The apparatus according to claim 1, wherein the received digital signal values are complex signals respectively including an inphase signal and a quadrature signal.

6. The apparatus according to claim 5, wherein said signal strength aligner divides the inphase signal and the quadrature signal by the signal strength average.

7. The apparatus according to claim 5, wherein:
    the inphase signal has a magnitude;
    the quadrature signal has a magnitude; and
    said signal strength determiner determines the signal strength value representing the signal strength of the current digital signal value by adding the magnitude of the inphase signal and the magnitude of the quadrature signal.

8. The apparatus according to claim 5, wherein said signal strength determiner determines the signal strength value representing the signal strength of the current digital signal value by:
    squaring the inphase signal to form a squared inphase signal,
    squaring the quadrature signal to form a squared quadrature signal, and
    adding the squared inphase signal and the squared quadrature signal.

9. The apparatus according to claim 1, wherein:
    said calculator for calculating the signal strength average tracked to the current digital signal value includes an adder producing the signal strength average by adding a previous signal strength average multiplied by $\lambda_1$ and the signal strength value of the current digital signal value multiplied by $\lambda_2$; and $\lambda_1 + \lambda_2 = 1$.

10. The apparatus according to claim 9, wherein said calculator for calculating the signal strength average tracked to the current signal value includes a register for storing the signal strength average, storing the respective current signal strength average, and making the respective current signal strength average available for calculating a next signal strength average.

11. The apparatus according to claim 9, wherein:

$\lambda_1 = 1 - 2^{-n}$;

$\lambda_2 = 2^{-n}$; and n is a natural number.

12. The apparatus according to claim 11, further comprising a shift register for multiplying the digital signal strength value for the current signal value by $\lambda_2$.

13. The apparatus according to claim 11, further comprising an adder and a shift register for multiplying the previous signal strength average by $\lambda_1$.

14. The apparatus according to claim 1, wherein said signal strength aligner aligns the current signal with the signal strength average only if a variation in the signal strength within the sequence exceeds a prescribed threshold.

15. The apparatus according to claim 1, wherein said signal strength aligner aligns the respective current digital signal values in the sequence with the respective signal strength averages for the sequence only if a maximum signal strength average for the sequence and a mean signal strength average for the sequence differ to a sufficient extent.

16. The apparatus according to claim 1, wherein said signal strength aligner aligns the respective current digital signal values in the sequence with the respective signal strength averages for the sequence only if a quotient of a maximum signal strength average for the sequence and of a mean signal strength average for the sequence exceeds a prescribed threshold value.

17. A reception unit for mobile radio transmission, comprising:
    a channel estimator ascertaining channel coefficients for modeling a transmission channel;
    a channel equalizer equalizing received signals using the channel coefficients ascertained by said channel estimator; and
    an apparatus for signal strength compensation according to claim 1 connected upstream of said channel estimator and said channel equalizer.

18. A method for signal strength compensation for a sequence of received digital signal values, which comprises the following steps:
    a) ascertaining a signal strength value representing a signal strength of a current signal value;
    b) determining a signal strength average tracked to the current signal value from previous signal values in the sequence; and
    c) aligning the current signal value with the signal strength average determined in step b) by using a calculation.

19. The method according to claim 18, which further comprises aligning the current signal value with the signal strength average determined in step b) by dividing the current signal value by the signal strength average.

20. The method according to claim 18, wherein the signal strength average is determined from respective signal strength values for the previous signal values in the sequence, including the signal strength value for the current signal value.

21. The method according to claim 18, which further comprises determining the signal strength average from respective signal strength values for the previous signal values in the sequence without the signal strength value for the current signal value, with step a) being able to be executed at least one of before and after step b).

22. The method according to claim 18, wherein the received digital signal values are complex signals respectively including an inphase signal and a quadrature signal.

23. The method according to claim 22, which further comprises aligning the current signal value with the signal strength average determined in step b) by dividing both the inphase signal and the quadrature signal by the signal strength average.

24. The method according to claim 22, which further comprises determining the signal strength value representing the signal strength of the current signal value by adding a magnitude of the inphase signal and a magnitude of the quadrature signal.

25. The method according to claim 22, which further comprises determining the signal strength value representing the signal strength of the current signal value by:
   squaring the inphase signal to yield a squared inphase signal,
   squaring the quadrature signal to yield a squared quadrature signal, and
   adding the squared inphase signal and the squared quadrature signal.

26. The method according to claim 18, which further comprises determining the signal strength average by adding a previous signal strength average multiplied by $\lambda_1$ and the signal strength value of the current signal value multiplied by $\lambda_2$, where $\lambda_1+\lambda_2=1$.

27. The method according to claim 26, wherein:

$\lambda_1=1-2^{-n}$;

$\lambda_2=2^{-n}$; and n is a natural number.

28. The method according to claim 18, which further comprises aligning the current signal value with the signal strength average determined in step b) only if a variation in the signal strength within the sequence exceeds a prescribed threshold.

29. The method according to claim 18, which further comprises aligning respective current signal values in the sequence with the respective signal strength averages for the sequence only if a maximum signal strength average for the sequence and a mean signal strength average for the sequence differ to a sufficient extent.

30. The method according to claim 18, which further comprises aligning respective current signals in the sequence with the respective signal strength averages for the sequence only if a quotient of a maximum signal strength average for the sequence and of a mean signal strength average for the sequence exceeds a prescribed threshold value.

* * * * *